United States Patent
Adams et al.

(10) Patent No.: US 6,874,111 B1
(45) Date of Patent: Mar. 29, 2005

(54) SYSTEM INITIALIZATION OF MICROCODE-BASED MEMORY BUILT-IN SELF-TEST

(75) Inventors: R. Dean Adams, St. George, VT (US); Thomas J. Eckenrode, Endicott, NY (US); Steven L. Gregor, Endicott, NY (US); Kamran Zarrineh, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 09/625,996

(22) Filed: Jul. 26, 2000

(51) Int. Cl.[7] ............................................. G01R 31/28
(52) U.S. Cl. ..................................... 714/733; 714/736
(58) Field of Search ............................... 714/733, 736, 714/744, 763, 726, 734, 718, 724, 719, 30, 732, 703; 365/201; 703/14

(56) References Cited

U.S. PATENT DOCUMENTS

| | | | |
|---|---|---|---|
| 5,155,819 A | | 10/1992 | Watkins et al. |
| 5,539,652 A | * | 7/1996 | Tegethoff ...................... 703/14 |
| 5,586,327 A | | 12/1996 | Bealkowski et al. |
| 5,615,335 A | * | 3/1997 | Onffroy et al. ................ 714/30 |
| 5,617,531 A | * | 4/1997 | Crouch et al. ................. 714/30 |
| 5,633,812 A | * | 5/1997 | Allen et al. .................... 703/15 |
| 5,640,354 A | | 6/1997 | Jang et al. |
| 5,745,500 A | | 4/1998 | Damarla et al. |
| 5,784,382 A | | 7/1998 | Byers et al. |
| 5,802,071 A | * | 9/1998 | Fang et al. ................... 714/724 |
| 5,901,095 A | | 5/1999 | Crafts |
| 5,909,404 A | | 6/1999 | Schwarz |
| 5,912,850 A | * | 6/1999 | Wood et al. ................. 365/201 |
| 5,937,154 A | * | 8/1999 | Tegethoff ...................... 714/30 |
| 5,982,681 A | * | 11/1999 | Schwarz ..................... 365/201 |
| 5,991,907 A | | 11/1999 | Stroud et al. |
| 6,003,150 A | | 12/1999 | Stroud et al. |
| 6,012,157 A | * | 1/2000 | Lu ............................. 714/741 |
| 6,070,252 A | * | 5/2000 | Xu et al. ....................... 714/30 |
| 6,108,798 A | * | 8/2000 | Heidel et al. ................. 714/30 |

FOREIGN PATENT DOCUMENTS

DE 19835258 2/2000

OTHER PUBLICATIONS

I.M. Ratiu & W.G.Tuten; "On–Card Sequencer Engine for Providing Control for Self–Test Operation"; IBM Technical Disclosure Bulletin; vol. 38, No. 06B, Jun. 1993; pps. 285–286.

* cited by examiner

*Primary Examiner*—Guy J. Lamarre
*Assistant Examiner*—Mujtaba Chaudry
(74) *Attorney, Agent, or Firm*—Whitham, Curtis & Christofferson, P.C.; Joseph P. Abate

(57) ABSTRACT

The functionality of a programmable memory built-in self-test (BIST) arrangement for testing an embedded memory structure of an integrated circuit is extended to system level testing to ascertain operability of the system after the integrated circuits and boards including them have been placed in service in larger systems, by generating default test signals which are loaded in an instruction store module when test instructions are not provided from an external tester. This additional utility of the BIST arrangement, increases efficiency of chip space utilization and improves the system level test. Loading of test instructions from an external tester during chip manufacture and/or board assembly is unaffected.

15 Claims, 4 Drawing Sheets

SYSTEM INITIALIZATION OF MICROCODE-BASED MEMORY BUILT-IN SELF-TEST

BACKGROUND OF THE INVENTION

1. Field of the Invention

The present invention generally relates to testing of integrated circuit devices including memory structures and systems including such integrated circuits and, more particularly, to extending built-in self-test (BIST) arrangements to systems testing.

2. Description of the Prior Art

Increases in integration density of integrated circuits has greatly increased the performance and functionality of the circuits which can be included on a single semiconductor chip. Increased functionality, of course, requires increased circuit complexity and, at the present state of the art, many functionally differentiated regions such as adders, processors, logic arrays, buffers, decoders level converters and the like may be included on a single chip. These functionally differentiated regions are often designed to operate at different clock rates and even different voltages while being required to communicate with each other in a generally synchronized fashion.

Design of storage devices and processes for their fabrication have become quite sophisticated and have resulted in very low process cost for fabrication and very small memory cell area. Therefore it is currently practical to form even relatively large numbers of storage cells together with digital signal processing circuitry on a single chip. Moreover, use of multi-port memories for communication between functional components on a chip has proven to be extremely fast and efficient and thus has come into relatively widespread use. These memories are generally referred to as embedded memories when included with circuits having other than a storage function on an integrated circuit chip.

Nevertheless, memory sells, particularly of the dynamic type which store data capacitively, are relatively delicate devices and may be subject to damage or deterioration during manufacture or after being placed in service. When such devices are used for communication and data transfer among functional regions or components, the reliability of storage devices becomes extremely critical to the proper operation of the entire chip. Therefore, it is desirable to test storage cells at different stages of manufacture, board assembly and during system operation. This test is done periodically or at certain system operating states such as power-up of the chip in order to ascertain operability of the memory structures. It is also desirable to provide for broader testing of the various functional elements of the system operating together. Such tests are generally referred to as system level tests by cannot generally be performed by programmable memory BIST arrangements as will be discussed below.

Nevertheless, system failures may be attributed to damage caused by external elements, minor manufacturing imperfections and/or aging of the materials, Damage from external elements could impact the correct functioning of an electronic system or any part thereof at any time during its useable life. However, minor manufacturing imperfections are the main cause of system failures at early stages of system operation while aging is the dominant cause of system failures at, later stages of the time of the system. For high reliability and availability applications such as banking and medical applications, it is essential to perform periodic testing of system modules.

Memory devices are usually in the critical path of a system or its respective components and therefore their design is directed to ensure that memories in critical paths operate several times faster than their surrounding logic which is realized through aggressive design utilizing dense fabrication and new technologies. These factors may make embedded memories somewhat more prone to failures due to minor manufacturing imperfections and aging and thus must be tested periodically after being placed in service in addition to manufacturing level and board level testing.

Further, system level tests could be performed by dedicated hardware, independent of that used for manufacturing level and board level tests. However, in such a case, the hardware dedicated to manufacturing level and board level testing which is generally provided as a built-in self-test arrangement would have no function after the system is placed in service while the additional hardware provided for system level testing would increase the hardware overhead for testing of all types.

However, access to embedded memories for testing is often difficult, particularly where chip space and external connections are at a premium. For that reason, it is preferred to form a self-test circuit on the chip, itself. Numerous types of such arrangements are known and generally referred to as a built-in self-test (BIST) circuit or engine. Some forms of BIST circuits have been developed which allow the test sequence to be dynamically modified based on results of test procedures in order to accelerate the testing process. The amount of chip space which can be efficiently allocated to a BIST arrangement is very limited, generally to about 2% of the area of the storage devices to be tested.

This area must also include space for an instruction or signal source, such as a read-only-memory (ROM) and, usually, a decoder, to generate the coded digital signals with which the embedded memory is to be exercised during the self-test operation. At the present state of the art, maintaining the BIST arrangement within such a chip area constraint presents a major challenge, particularly where the memory structure is complex and extended numbers of sequences of signals are required to adequately test the memory and/or to capture signals from the memory for evaluation in the course of the self-test.

Even when the chip area is limited to a small percentage of the area of the memory to be tested, the chip space is considered to be inefficiently used since the BIST arrangement is not used in the other intended functions of the chip. Nevertheless, the use of a BIST arrangement may be the only practical technique for accessing the signal lines necessary for testing of an embedded memory. Accordingly, BIST architectures, including programmable memory BIST architectures which can alter the test procedure in response to test results, have been developed. Programmable BIST architectures also can accommodate different memory test signal patterns that may be required for different memory structures without significant hardware modification and associated design costs.

A programmable memory BIST arrangement often includes a programmable memory BIST controller and other components to generate the signals necessary to fully exercise and test the particular memory structure of interest. The programmable memory BIST controller generally includes a microcode-based controller and an instruction decode module which will develop one or more multi-bit signals (e.g. multi-bit data, address and control signals) for each instruction.

The instructions supported by the programmable memory BIST controller describe or constitute a memory test algorithm appropriate to the particular embedded memory to be tested and are stored in an instruction store module, preferably (or conceptually) within the microcode based controller. The instruction store module may be of any of a variety of forms including but not limited to a read only memory (ROM) such as an EEPROM or a register file. In the former case (e.g. where storage is non-volatile) no loading of the test instructions is necessary and may not be possible. Also, ROM and small RAM modules complicate the overall testing of the system.

Therefore, the use of a register file for storage of test instructions is generally preferred. In this case, the instructions for a particular desired test are loaded during the test process by means of an external tester. (It should be appreciated that while an external tester may be required for conducting a test procedure, the BIST may provide access to particular connections in the memory structures which are impractical to access otherwise.)

In a manufacturing level test (e.g. during chip manufacture and packaging) the supported instructions representing the test algorithm are input from an external tester as described above. If the storage elements in the register file are scannable, the loading process is performed serially using any scan protocol which has been adopted and/or which may be convenient. In board level testing in accordance with the IEEE 1149.1 standard, the register file is defined as a test data register and is accessed by loading an appropriate IEEE 1149.1 instruction in the instruction register. The memory test instructions are loaded using an external tester while the test access port (TAP) controller is in the SHIFT-DR state.

However, the BIST modules that use register files as their instruction store module cannot be used for system level tests. This is due to the fact that register files need to be initialized to the instruction set representing the test algorithm. Therefore, the BIST arrangement is confined to use in lower level tests where an external control of such initialization and source of test algorithm is available and thus represents a substantial inefficiency in utilization of chip space, as alluded to above, even though the BIST arrangement is substantially essential to assure functionality of a chip and the board which includes it.

SUMMARY OF THE INVENTION

It is therefore an object of the present invention to provide an enhancement to a programmable memory BIST arrangement; expanding its utility to system level tests.

It is another object of the invention to provide an increase in efficiency of chip space utilization for BIST arrangements.

It is a further object of the invention to provide a default initialization capability for a programmable memory BIST arrangement to load a default set of desired test instructions if not provided by an external tester.

In order to accomplish these and other objects of the invention, an integrated circuit and an electronic system including an integrated circuit are provided, including a storage device for storing test instructions including an arrangement for receiving test instructions provided from an external tester, an arrangement for generating default test instructions, and an arrangement for supplying the default test instructions to the storage device for storing test instructions.

In accordance with another aspect of the invention, a method of performing system level testing of an electronic system is provided including steps of providing a system level test algorithm in a built-in self-test arrangement, transferring the system level test algorithm to an arrangement for storing a test algorithm, and operating the built-in self-test arrangement using the system level test algorithm.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
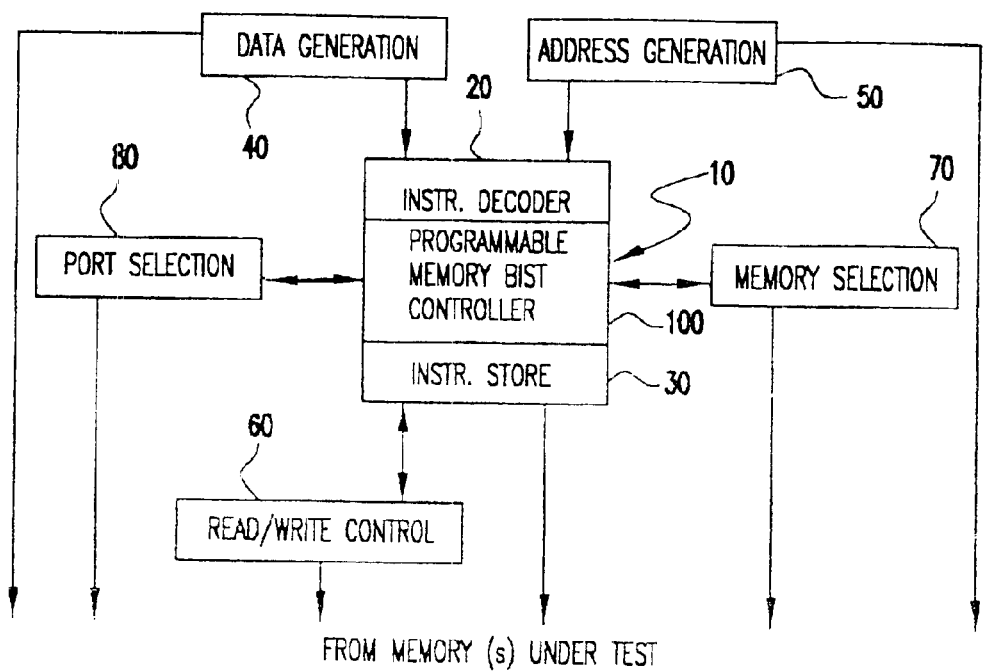
FIG. 1 is a high-level block diagram of an exemplary architecture of a programmable memory BIST arrangement.
Figure 2:
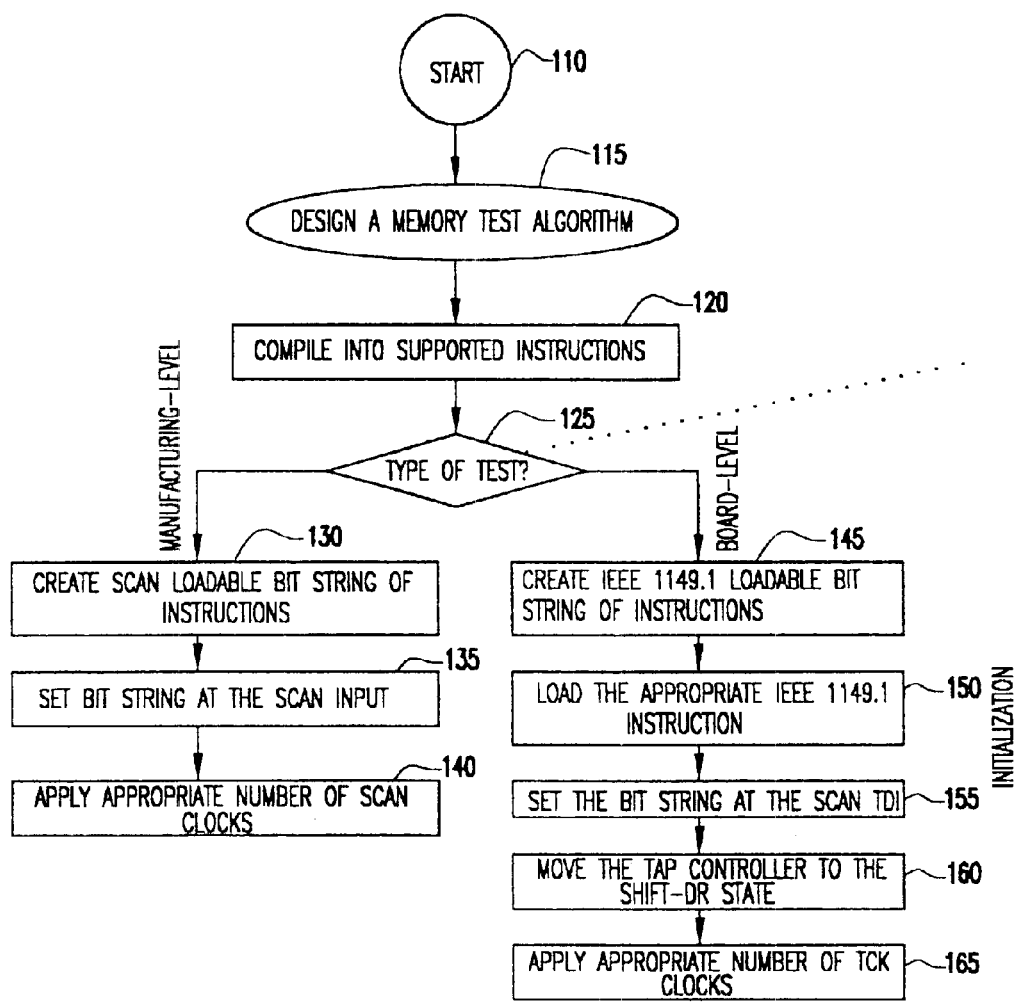
FIG. 2 is a flow diagram illustrating initialization for manufacturing level and board level testing.
Figure 3:
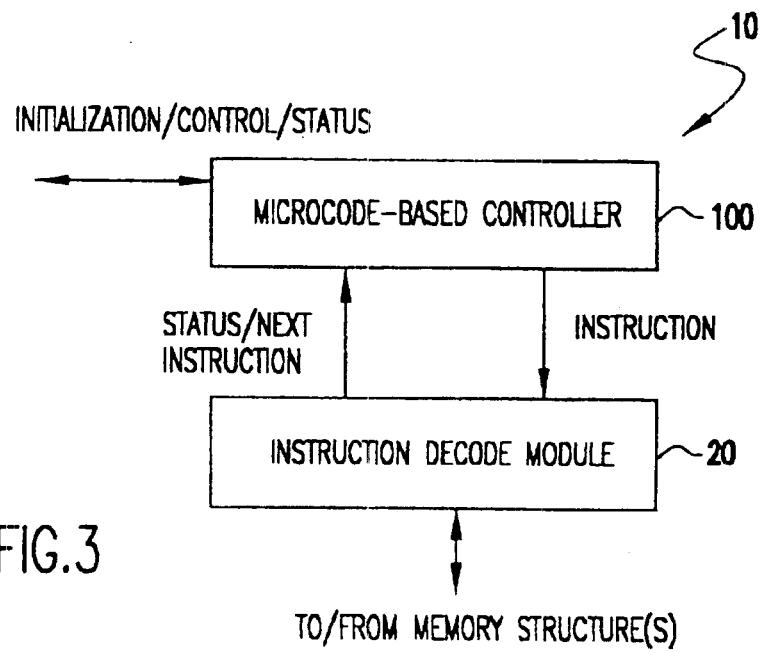
FIG. 3 is a high-level block diagram illustrating a generalized overview of a programmable memory BIST architecture.

Referring now to the drawings, and more particularly to FIG. 1, there is shown a high-level block diagram of an exemplary architecture of a programmable memory BIST module. (It should understood that the depiction of FIGS. 1–3 are arranged to convey an understanding of the invention and are not admitted to be prior art as to the present invention.) Central to this architecture is a programmable memory BIST controller 10 which preferably includes a microcode based controller 100, an instruction sore module 30 (both shown in FIG. 3 and an instruction decode module 20).

The instruction decode module generates or controls generation of digital signals including data (40), address (50) and control (60) signal generators with which the memory under test is to be exercised. It is also generally desirable to provide for selection of a portion of memory to be tested (70) and selection of a port (80) through which test instructions may be loaded and responses to test signals are retrieved from the memory-under-test for analysis. Bi-directional communications are illustrated between controller 10 and signal generators and selectors 40–80 to indicate both control by the controller and the reporting of status of the respective generators and selectors and calls for next instructions. Unidirectional communications to the memory indicate that the BIST arrangement is principally concerned with the exercising of the memory structure of interest and, while provisions for retrieval of signals from the memory responsive to the test procedure may be provided within the BIST arrangement, such arrangements are generally well-understood by those skilled in the art and need not be further discussed.

The development and initialization of manufacturing level and board level tests are illustrated in FIG. 2. The process is begun (110) in the course of design of an integrated circuit including an embedded memory which must be designed to accommodate particular functions of the chip such as communications between functional elements as alluded to above. Assuming the memory structure to be of a new design for which suitable tests have not been previously developed, the memory test algorithm is generally approached as a description of a number of behaviors which the memory structure must be controlled to provide, as indicated at 115. This set of behaviors is then compiled into a list of supported instructions which will result in the generation of signals to be applied to the memory structure to cause those behaviors to be executed, as indicated at 120.

Generally, several tests will be developed to test the functionality of the chip and/or board at different points during manufacture or assembly. All or a plurality of these test algorithms are resident in memory of external test apparatus used as part of the manufacturing process or line and may be chosen at the will of an operator or automated, as may be convenient or appropriate to a particular application. When a particular test procedure is chosen, the type of test procedure is determined at 125 to be either of the manufacturing level or board level test type.

If the test is of the manufacturing level type and the instruction store module of the BIST arrangement is of the register file type and scannable (as is assumed for purposes of this discussion), a scan loadable bit string of instructions is created at 130 and applied to the scan input, as indicated at 135. The bit string is then loaded as instructions by applying an appropriate number of scan clocks to the programmable memory BIST controller 10 to load the bit string into the instruction store module 30.

If, on the other hand, the test is of the board level type, a bit string in accordance with the IEEE 1149.1 standard is created, as indicated at 145, and an appropriate IEEE 1149.1 instruction is loaded into the instruction store module as instructions by applying an appropriate number of clock cycles, as indicated at 150. The bit string is then applied to the test data interface (TDI), as indicated at 155 and the test access port (TAP) controller is set to the SHIFT-DR state, as indicated at 160 and an appropriate number of clock cycles are applied to transfer the bit string into the instruction store module 30 as indicated at 165.

As was described above, in both manufacturing and board-level assembly tests, a bit string representing the selected memory test algorithm is first loaded in the buffers of an external tester. By using the appropriate scan protocol, the external tester loads this bit string in the instruction store module. Therefore a programmable memory BIST depends upon the availability on an external tester and therefore, in the absence of the present invention, cannot be used for system level testing where an external tester is not available to initialize the programmable memory BIST with the bit string representing the test algorithm.

Figure 4:
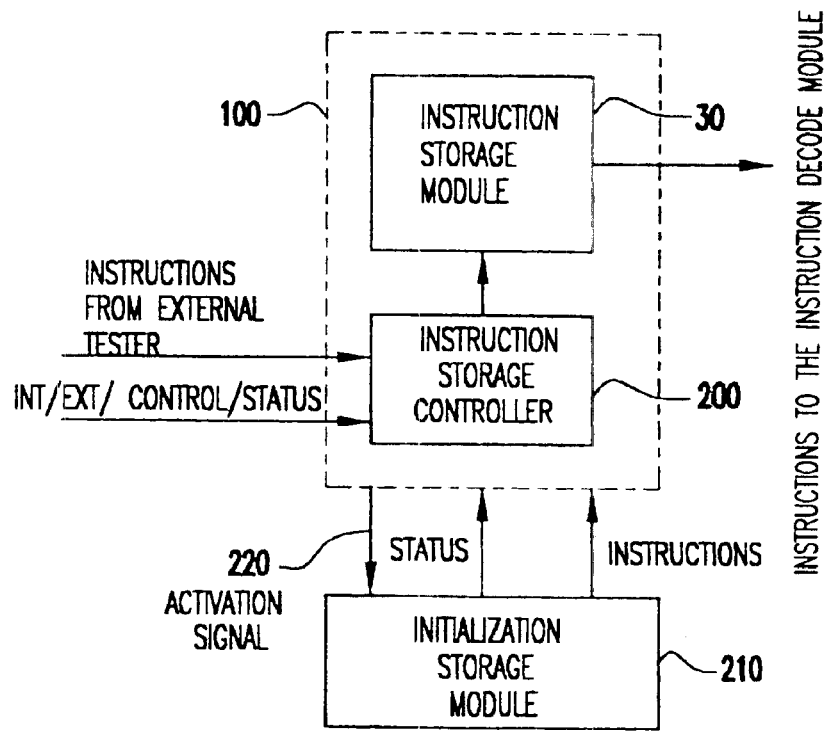
FIG. 4 is a high level block diagram of the microcode based controller in accordance with the invention for a programmable memory BIST architecture such as that illustrated in FIG. 1 or 3.

Referring now to FIGS. 3 and 4, the architecture of a programmable memory BIST arrangement which is also useable for system level testing will now be explained. The architecture of a programmable memory BIST architecture as illustrated in FIG. 1 and particularly the programmable memory BIST controller 10 can also be conceptualized as shown in FIG. 3, comprising primarily a microcode-based controller 100 and an instruction decode module. The controller 100 provides instructions to the instruction decoder module 20 and receives status signals and next instruction requests therefrom. The instruction decode module, in turn, communicates with specific signal generators and/or registers which supply test signal patterns and sequences to the memory structure under test. The microcode-based controller 100 also receives test instructions for tester initialization, status signals and control signals from an external tester or an associated circuit such as a power-up state detector.

As discussed above in regard to FIG. 1, controller 100 also includes an instruction store module 30 and, in accordance with the invention, an instruction storage controller 200 which receives the test instructions and control and status signals from an external tester or other associated circuit as alluded to above. Further, in accordance with the invention, an initialization storage module 210 is also provided as an input to instruction storage controller 200.

A principal function of the instruction storage controller 200 is to provide an activation signal 22o to the initialization storage module 210 when a test procedure is called but no test instructions are made available from an external tester. Upon receipt of such an activation signal 220, the initialization storage module provides default test instructions and status signals (e.g. to indicate completion of read-out) to the storage controller 200. Clock signals may also be provided by the initialization storage module 210, if desired or not otherwise available.

It is preferred that the default test instructions stored in the initialization storage module 210 be directed to system level tests but there is no technical necessity for such a limited application of the invention. That is, any desired test can be stored and supplied as a default test for storage in the instruction store module 30 of the programmable memory BIST controller 10 from which the test procedure can be executed in the normal manner. Further, by virtue of the transfer of the default test instructions from the initialization storage module 210 to the instruction store module 30, the facility for loading instructions for a particular test of either the manufacturing level type or the board level type is unaffected by the inclusion of the invention in the programmable memory BIST controller, as is particularly evident from FIG. 5.

Figure 5:
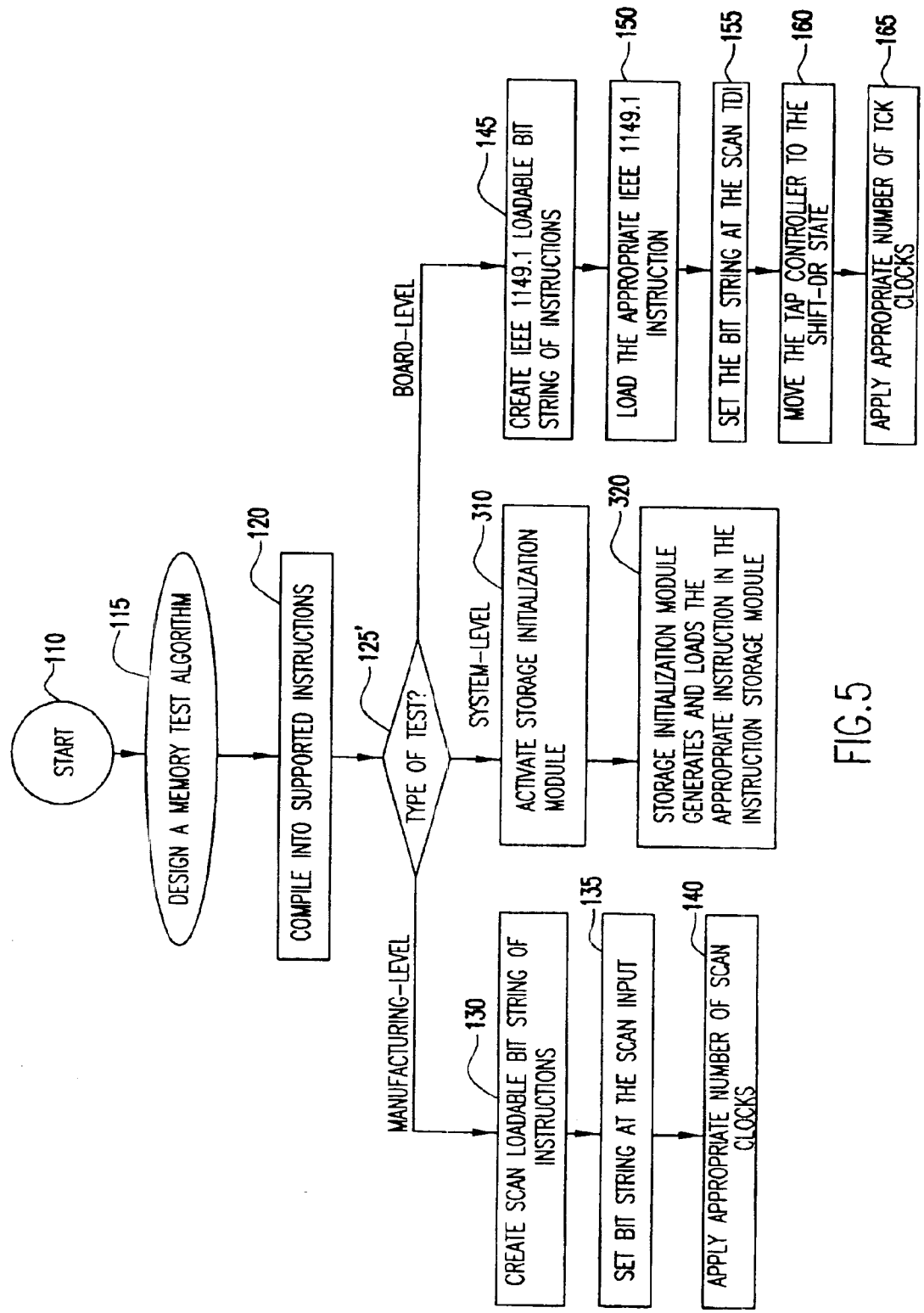
FIG. 5 is a flow chart illustrating the operation of the invention as an additional capability beyond that of FIG. 2.

FIG. 5 illustrates the operation of initialization in accordance with the invention. It will be appreciated that, with the exception of 125', steps 110–165 are the same as those shown in FIG. 2 and discussed above. In the preferred form of the invention illustrated in FIG. 5, however, the determination of the type of test discriminates between three possibilities: manufacturing level, board level and system level. Manufacturing level and board level test discrimination is unaffected.

In the preferred embodiment of the invention, the system level tests may be discriminated by the absence of instructions from an external tester. However, other techniques such as discrimination of a source of a test command or a particular test command, itself could be used and could call for transfer of instructions from a selected initialization storage module 210 if more than one such initialization storage module is provided. The only limit on the number of types of tests which could be selectively supplied as defaults is the number of conditions which can be readily discriminated and the amount of chip area which can be considered as efficiently allocated to storage or other hardware for generation of instructions for different system or other level tests for which an external tester cannot readily be used.

When a test is called and it is determined that test instructions are not available from an external tester, the initialization storage module is activated by signal 220, as discussed above and illustrated at 310 of FIG. 5. When activated, the initialization storage module 210 generates and loads default test instructions to the instruction store module 30 of programmable memory BIST controller 10, as shown at 320 of FIG. 5. However, when test instructions are, in fact, available, the initialization storage module is not activated and board level or manufacturing level test instructions are loaded in the normal fashion.

In view of the foregoing, it is seen that the invention provides additional utility and functionality for a built-in self-test arrangement and thus improves efficiency of chip space usage and allocation. The invention allows full flexibility of programming of a programmable memory BIST arrangement while allowing additional desired testing to be performed independent of an external tester such as system level tests after the chip with an embedded memory and/or board including such a chip has been placed in service.

While the invention has been described in terms of a single preferred embodiment, those skilled in the art will recognize that the invention can be practiced with modification within the spirit and scope of the appended claims.

What is claimed is:

1. An integrated circuit including an embedded memory and a built-in self-test arrangement comprising means for storing test instructions and discriminating between performing manufacturing level or board level testing and system level testing based on receiving test instructions provided from an external tester, means for generating default test instructions for performing system level testing when test instructions are not provided by said external tester, and means for supplying said default test instructions for performing system level testing to said means for storing test instructions, wherein said means for generating default test instructions includes an initialization storage means for providing signals for initializing said means for storing test instructions in the absence of said test instructions provided from an external tester.

2. An integrated circuit as recited in claim 1, wherein said initialization storage means is a storage initialization module.

3. An integrated circuit as recited in claim 1, further including means for activating said means for generating said default test instructions responsive to an absence of test instructions from an external tester.

4. An integrated circuit as recited in claim 1, further including means for controlling a test operation, wherein said means for controlling a test operation includes means for supplying a control signal to an instruction storage controller and further includes said means for storing said test instructions.

5. An integrated circuit as recited in claim 4, further including means for activating said means for generating said default test instructions when only said control signal is supplied to said instruction storage controller.

6. An integrated circuit as recited in claim 1, wherein said means for generating default test instructions includes a memory for storing said default test instructions.

7. An electronic system including an integrated circuit having a built-in self-test arrangement therein, said integrated circuit comprising means for storing test instructions and discriminating between performing manufacturing level or board level testing and system level testing based on receiving test instructions provided from an external tester, means for generating default test instructions for performing system level testing in absence of instructions from an external tester, and means for supplying said default test instructions for performing system level testing to said means for storing test instructions, wherein said means for generating default test instructions includes an initialization storage means for providing signals for initializing said means for storing test instructions in the absence of said test instructions provided from an external tester.

8. A system as recited in claim 7, wherein said initialization storage means is a storage initialization module.

9. A system as recited in claim 7, further including means for activating said means for generating said default test instructions responsive to an absence of test instructions from an external tester.

10. A system as recited in claim 7, further including means for controlling a test operation, wherein said means for controlling a test operation includes means for supplying a control signal to an instruction storage controller for providing signals for initializing said means for storing said test instructions.

11. A system as recited in claim 10, further including means for activating said means for generating said default test instructions when only said control signal is supplied to said instruction storage controller.

12. A system as recited in claim 10, wherein said control signal is supplied from an external tester.

13. A system as recited in claim 10, wherein said control signal is supplied from within said system.

14. A system as recited in claim 7, wherein said means for generating default test instructions includes a memory for storing said default test instructions.

15. A method of performing system level tests on an electronic system including an integrated circuit having a built-in self-test (BIST) arrangement therein for performing manufacturing level or board level testing and including means for storing a test algorithm, said method comprising steps of discriminating a source of a test command, providing a system level test algorithm from said BIST arrangement in absence of instructions from an external tester, transferring said system level test algorithm to said means for storing a test algorithm in said BIST arrangement, and operating said BIST arrangement using said system level test algorithm.

* * * * *